(12) United States Patent
Engling et al.

(10) Patent No.: US 7,462,919 B2
(45) Date of Patent: Dec. 9, 2008

(54) MICROELECTROMECHANICAL COMPONENT AND METHOD FOR THE PRODUCTION THEREOF

(75) Inventors: Thomas Engling, Königsbronn (DE); Martin Petz, Hohenkammer (DE)

(73) Assignee: Infineon Technologies AG, Munich (DE)

(*) Notice: Subject to any disclaimer, the term of this patent is extended or adjusted under 35 U.S.C. 154(b) by 2 days.

(21) Appl. No.: 10/558,114

(22) PCT Filed: May 24, 2004

(86) PCT No.: PCT/DE2004/001080

§ 371 (c)(1),
(2), (4) Date: Nov. 30, 2006

(87) PCT Pub. No.: WO2004/106222

PCT Pub. Date: Dec. 9, 2004

(65) Prior Publication Data

US 2007/0090473 A1 Apr. 26, 2007

(30) Foreign Application Priority Data

May 26, 2003 (DE) ............................... 103 24 139

(51) Int. Cl.
*H01L 29/84* (2006.01)
(52) U.S. Cl. ........................................ 257/419; 438/53
(58) Field of Classification Search .................. 438/53; 257/419
See application file for complete search history.

(56) References Cited

U.S. PATENT DOCUMENTS

| 5,207,102 | A | 5/1993 | Takahashi et al. |
| 6,254,815 | B1 | 7/2001 | Cheperak |
| 6,300,169 | B1 | 10/2001 | Weiblen et al. |
| 6,432,737 | B1 | 8/2002 | Webster |
| 2007/0069354 | A1* | 3/2007 | Dangelmaier et al. ....... 257/678 |

FOREIGN PATENT DOCUMENTS

| DE | 102 16 019 | 10/2002 |
| EP | 0286867 | 3/1988 |
| WO | 02/093642 | 11/2002 |

OTHER PUBLICATIONS

Mann J W ED "A computer-aided, spatially-selective protection technique for multichip module and chip-on-board devices" May 18-20, 1992, IEEE.

* cited by examiner

*Primary Examiner*—W. David Coleman
(74) *Attorney, Agent, or Firm*—Dicke, Billig, Czaja PLLC

(57) ABSTRACT

A microelectromechanical component and to a method for the production thereof is disclosed. In one embodiment, the microelectromechanical component has a pressure-sensitive semiconductor chip, which is covered in its pressure-sensitive region by a rubber-elastic layer and is arranged in a cavity housing and covered by a rubber-elastic covering. This rubber-elastic covering has a greater thickness than the rubber-elastic layer on the pressure-sensitive region.

23 Claims, 3 Drawing Sheets

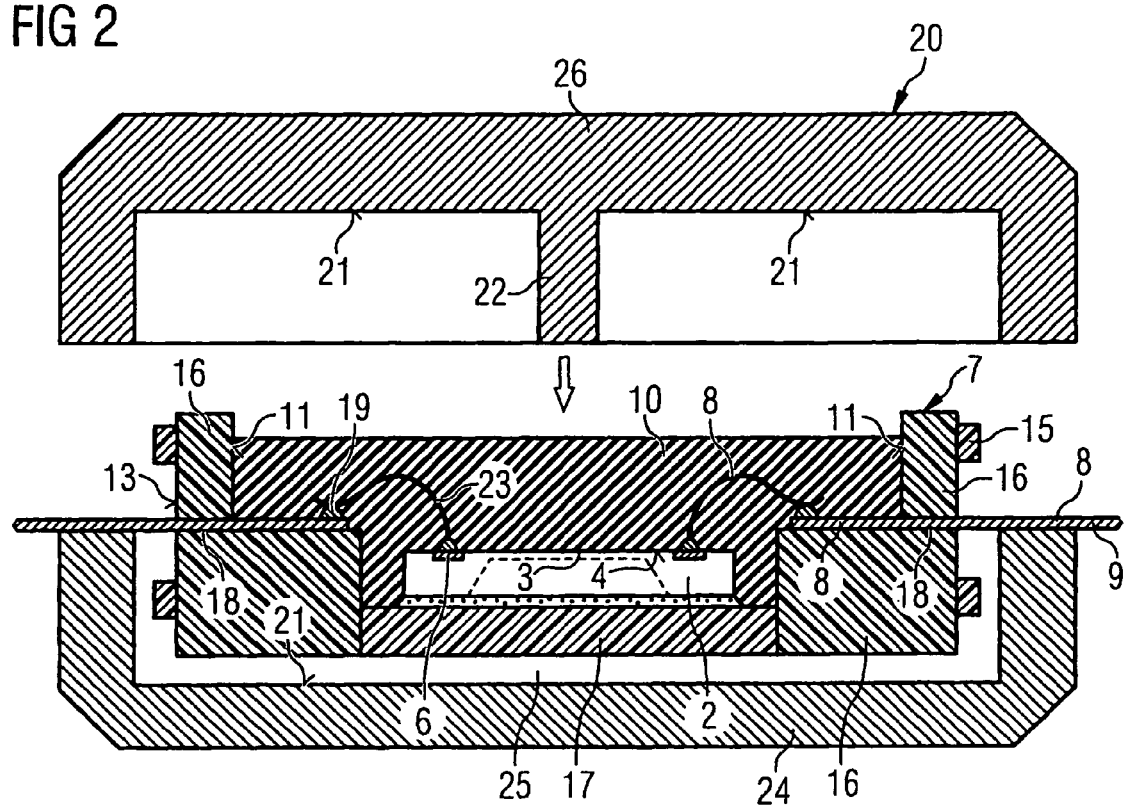
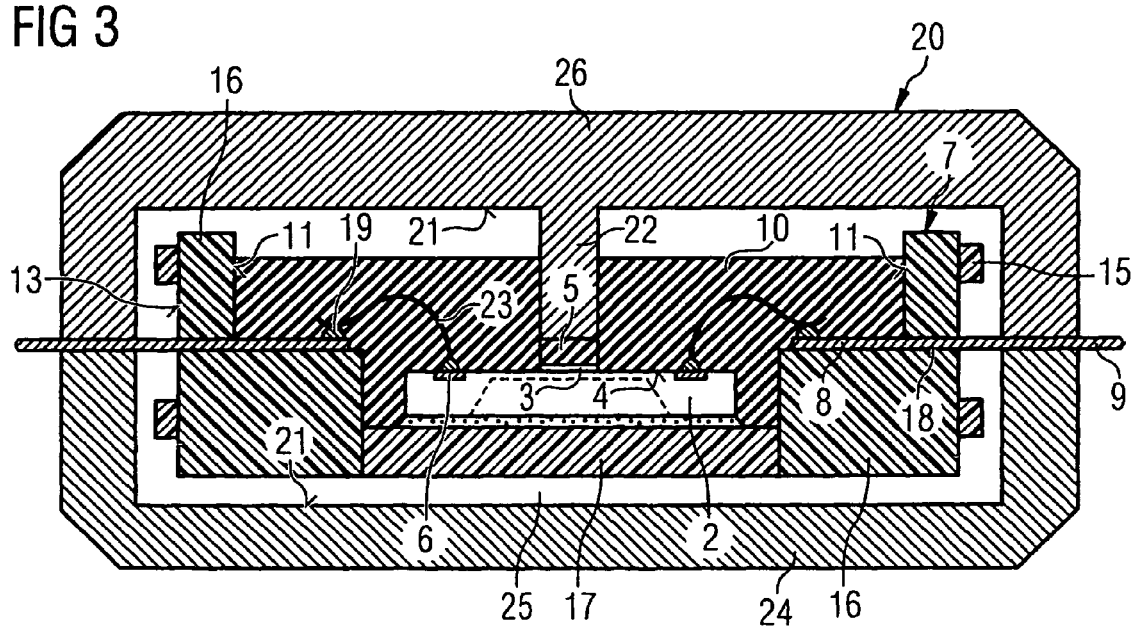

MICROELECTROMECHANICAL COMPONENT AND METHOD FOR THE PRODUCTION THEREOF

CROSS REFERENCE TO RELATED APPLICATIONS

This Utility Patent Application claims the benefit of the filing date of Application Number DE 103 24 139.6, filed May 26, 2003 and International Application No. PCT/DE2004/001080, filed May 24, 2004, all of which are herein incorporated by reference.

FIELD OF THE INVENTION

The invention relates to a microelectromechanical component and to a method for the production thereof. The microelectromechanical component has a semiconductor chip with a pressure-sensitive region. The semiconductor chip is arranged in a prefabricated cavity housing that is open on one side, it being possible for a pressure-sensitive region to be exposed to the outside pressure through the prefabricated cavity housing that is open on one side.

BACKGROUND

An electronic component of this type is known from the document DE 42 03 832-A. The known semiconductor sensor is embedded in an outer encapsulation of epoxy resin, the pressure-sensitive region being freely accessible in the form of a membrane on the active upper side of the semiconductor. The entire semiconductor chip is arranged on a carrier, which is likewise cast in the encapsulation. A sensor of this type has the disadvantage that it cannot be used in aggressive media, especially since the pressure-sensitive area of the semiconductor chip is exposed to the surroundings unprotected.

A further microelectromechanical component is known from the document U.S. Pat. No. 6,401,545 B1, in which the pressure-sensitive region of the semiconductor chip is protected from damage and aggressive media by a rubber-elastic covering. However, a solution of this type has the disadvantage that this covering covers the entire cavity of a cavity housing, and that, when there are great changes in pressure, the rubber-elastic layer has the tendency to crack and form entrapped air bubbles. These entrapped air bubbles impair the sensitivity of the pressure-sensitive region and the overall stability of the sensor.

SUMMARY

The present invention provides a microelectromechanical component in which the formation of air bubbles under extreme operating conditions, such as great changes in pressure, is reduced and the sensitivity is maintained without degradation over the entire service life of the microelectromechanical component.

According to one embodiment of the invention, a microelectromechanical component which comprises a semiconductor chip with a pressure-sensitive region on its active upper side is provided. The pressure-sensitive region is covered by a rubber-elastic layer, while outside the pressure-sensitive region contact areas are arranged on the active upper side of the semiconductor chip.

In addition, the microelectromechanical component comprises a prefabricated cavity housing that is open on one side, with electrical connections between external terminals of the component and the contact areas of the semiconductor chip. These electrical connections are cast into the cavity housing while it is being produced, that is to say while the side walls of the cavity housing are being injection-molded. This casting-in then takes place by external terminals extending to the outside and partial regions of the electrical connections in the form of contact terminal areas being present inward toward the cavity. A rubber-elastic covering, which covers the upper side of the semiconductor chip, partial regions of the electrical connections in the interior of the cavity housing and inner sides of the cavity housing, is arranged in the cavity housing that is open on one side, over the semiconductor chip.

To avoid air bubbles and cracks forming in the rubber-elastic covering, in particular under high acceleration loads, this region of the microelectromechanical component is covered with a rigid plastic encapsulation, which not only protects the rubber-elastic covering but also covers the outer sides of the prefabricated cavity housing.

Only one opening, the size of which corresponds to the pressure-sensitive region, is kept free in the plastic encapsulation and has an opening depth, so that the pressure-sensitive region of the semiconductor chip remains covered only by a thin, rubber-elastic layer. Thin, rubber-elastic layers of this type do not have a tendency for bubbles to form and ensure reliable functioning of the pressure-sensitive region even under extreme loads. The rubber-elastic layer consequently has a smaller thickness than the rubber-elastic covering and the size of the rubber-elastic layer corresponds to the size of the opening in the plastic encapsulation and the size of the pressure-sensitive region of the semiconductor chip.

These sizes and thicknesses, which are made to match one another, improve the service life of the pressure-sensitive semiconductor chip, and with it also the service life of the microelectromechanical component. In this case, the plastic encapsulation acts like a clamp, which ensures a great dimensional stability and encloses the rubber-elastic covering in a dimensionally stable manner. This creates a microelectromechanical component which has in principle the form of a double-walled cavity, only one opening in this double-walled cavity form being exposed to the medium that is to be measured, to be precise an opening of exactly a size that corresponds to the sensor region of the semiconductor chip.

In order to transport the pressure signals from the sensor region of the semiconductor chip to the external terminals, the semiconductor chip has on its active upper side contact areas which lead by means of bonding wires to partial regions in the form of contact terminal areas of the electrical connections, which pass through the double wall of the cavity housing with the encapsulation and are electrically connected to external terminals.

For anchoring the cavity housing in the plastic encapsulation, the prefabricated cavity housing has anchoring elements on its outer sides. The anchoring elements are interlocked with positive engagement with the plastic encapsulation, so that a reliable fit of the prefabricated cavity housing in the plastic encapsulation remains ensured. While the prefabricated housing and the plastic encapsulation are produced from epoxy resin, the rubber-elastic covering and the rubber-elastic layer comprise a silicone rubber or silicone gel, which transfers the pressure present in the opening of the plastic encapsulation to the pressure-sensitive region on the active upper side of the semiconductor chip.

Via corresponding interconnects from the pressure-sensitive region to contact areas arranged outside the pressure region, the sensor signals are passed by means of bonding wires to the electrical connections to the external terminals. The microelectromechanical component according to the invention has the advantage of an increased service life and is not damaged even when there are great changes in pressure or under high acceleration forces.

In one embodiment, a method for producing a microelectromechanical component with a pressure-sensitive semiconductor chip has the following method process. Firstly, a semiconductor chip with a pressure-sensitive region on its active upper side and with contact areas outside the pressure-sensitive region is provided. Furthermore, a cavity housing that is open on one side, with side walls and a cavity base, is injection-molded. Electrical leadthroughs, which have external terminals and inner contact terminal areas and are cast into the side walls of the cavity housing during the injection-molding are placed into the injection mold for the cavity housing. Subsequently, the semiconductor chip is arranged on the cavity base and fixed, layers of pressure-resistant plastic being used. After the fixing of the pressure-sensitive semiconductor chip on the cavity base, electrical connections are established between the contact terminal areas of the cavity housing and the contact areas of the semiconductor chip. This may take place by introducing bonding connections.

After the electrical wiring of the semiconductor chip in the cavity housing, a rubber-elastic covering compound is introduced into the cavity housing, thereby filling the cavity with the covering. This covering embeds both the bonding connections and the semiconductor chip with a pressure-sensitive region into the covering compound, which preferably comprises a silicone gel. After that, the cavity housing with the covering compound is installed in an open injection mold, while retaining a distance from the inner sides of the injection mold.

The injection mold has a punch for immersion in the rubber-elastic covering compound. This punch is arranged in such a way that, when it is immersed in the rubber-elastic covering compound, it covers the pressure-sensitive region of the semiconductor chip but maintains a distance from this pressure-sensitive region. When the injection mold is closed, a rubber-elastic layer corresponding to the distance consequently forms between the punch and the pressure-sensitive region of the semiconductor chip. The thickness of this rubber-elastic layer corresponds to the distance between the punch and the pressure-sensitive region and is consequently thinner than the rubber-elastic covering on the rest of the semiconductor region, and in the remaining cavity of the prefabricated cavity housing. After the injection mold is closed, a plastic molding compound is admitted into the injection mold as a plastic encapsulation. In this case, the outer sides of the prefabricated cavity housing and the rubber-elastic covering are encapsulated by the plastic molding compound. An opening to the rubber-elastic layer on the pressure-sensitive region of the semiconductor chip forms in the region of the punch. After the plastic encapsulation is cured by thermal treatment of the epoxy resin of the plastic encapsulation, the injection mold is moved apart and the finished microelectromechanical component can be removed from the injection mold.

In one embodiment, it can be stated that the microelectromechanical component corresponding to the invention has a double housing, to be specific a prefabricated cavity housing and a plastic encapsulation enclosing this cavity housing and the cavity filled with gel. The cavity filled with gel serves as a stress buffer, that is to say that no mechanical prestresses act on the semiconductor chip. The plastic encapsulation serves for protecting against external mechanical influences and in particular protects the rubber-elastic, gel-like covering compound against the formation of air bubbles, cracks and chemomechanical decomposition.

Furthermore, it can be stated that the two housings are mechanically firmly anchored one in the other, especially since the outer sides of the cavity housing have anchoring elements which are cast into the plastic encapsulation. Finally, during the injection-molding, the punch has the effect of creating an opening which, on the one hand, corresponds in its size to the pressure-sensitive region of the semiconductor chip and, on the other hand, establishes directly over the pressure-sensitive membrane a gel layer thickness which is greatly reduced and consequently does not bring about any signal falsification under high accelerations, as would occur if the thickness of the covering compound were retained.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description.

FIG. 2 illustrates a schematic cross section through an open injection mold with an inserted microelectromechanical component with a cavity housing and rubber-elastic silicone gel covering.

FIG. 3 illustrates a schematic cross section through a closed injection mold according to FIG. 2 before injection of a plastic encapsulation.

DETAILED DESCRIPTION

Figure 1:
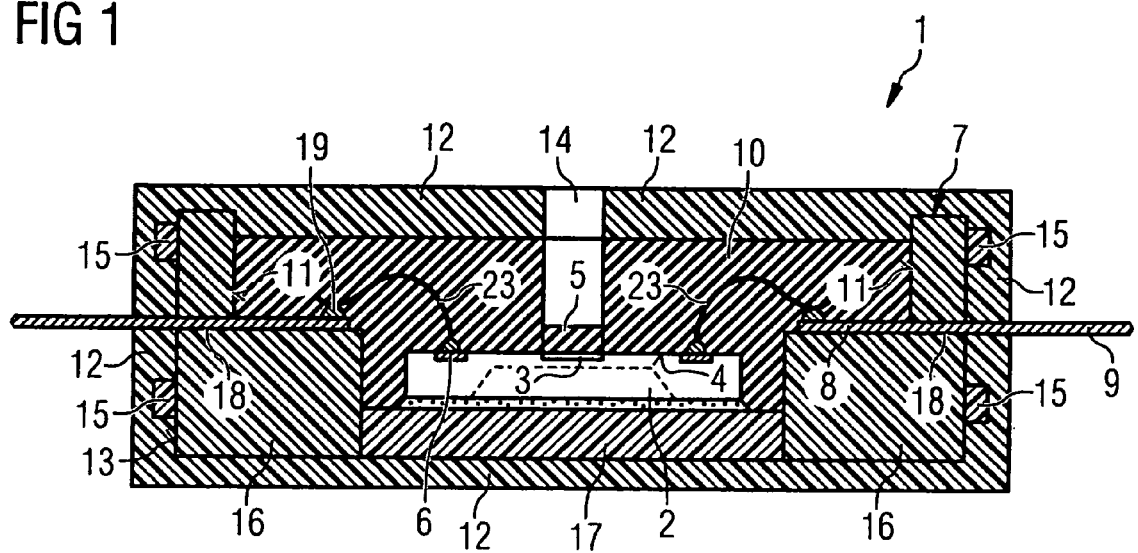
FIG. 1 illustrates a schematic cross section through a microelectromechanical component of an embodiment of the invention.

FIG. 1 illustrates a schematic cross section through a microelectromechanical component 1 of an embodiment of the invention. This microelectromechanical component has two housings, one nested inside the other. In an outer region, it has as an outer housing a plastic encapsulation 12 of an epoxy resin and, embedded in it as an inner housing, a cavity housing 7. The cavity housing 7 is in one piece and has cavity walls 16 and a cavity base 17.

The cavity of the cavity housing 7 is filled with a rubber-elastic silicone gel. In this silicone gel, the semiconductor chip 2 is embedded in a stress-free manner with its pressure-sensitive region 3. The silicone gel forms a rubber-elastic covering 10, which is reduced to a rubber-elastic layer 5 in the pressure-sensitive region 3 of the semiconductor chip 2. The thickness of the rubber-elastic layer is less than the thickness of the rubber-elastic covering 10. The size of the rubber-elastic layer 5 corresponds to the size of the pressure-sensitive region 3 on the active upper side 4 of the semiconductor chip 2. Furthermore, the size of the rubber-elastic layer 5 corresponds to the size of an opening 14 in the plastic encapsulation 12.

A pressure exchange between the surroundings and the pressure-sensitive region 3 can take place in a stress-free manner via this opening, reduced to the size of the pressure-sensitive region 3, in the otherwise upwardly open cavity housing 7, since the semiconductor chip has a rubber-elastic covering layer 10 on its entire upper side. The rubber-elastic covering also partly covers the inner sides 11 of the cavity housing 7. Reducing the thickness of the covering 10 to the thickness of the rubber-elastic layer 5 has the effect of reducing the probability of damage caused by cracks or bubble formation in the layer 5 under loads caused by high accelerations.

The rigid plastic encapsulation additionally achieves the effect that bubbles which reduce the sensitivity of the sensor and are the cause of signal falsifications also do not form in the rubber-elastic covering layer. The pressure-sensitive region 3 generates a pressure signal, which is transmitted via interconnects on the active upper side 4 of the semiconductor chip 2 to the contact areas 6 in a region outside the pressure-sensitive region. From there, the sensor signals are passed by means of bonding connections 23 to contact terminal areas 19 of the electrical connections 8 via leadthroughs 18 to external terminals 9 of the microelectromechanical component 1. In order to ensure reliable bonding, the contact terminal areas 19 are arranged on a pedestal-like projection in the interior of the cavity housing 7 and covered by a bondable layer. The cavity housing 7 with the electrical connections 8 is cast in one piece in a single injection-molding process. In a further injection-molding process, the plastic encapsulation is applied after applying the rubber-elastic covering. With the aid of anchoring elements 15 on the outer sides 13 of the cavity housing 7, the cavity housing 7 and the plastic encapsulation 12 are anchored to each other. Apart from the opening 14, the plastic encapsulation 12 also covers the rubber-elastic covering 10 in the cavity of the cavity housing 7, so that the covering compound of the rubber-like covering 10 remains protected against damage such as bubble formation and/or crack formation.

FIG. 2 illustrates a schematic cross section through an open injection mold 20 with an inserted microelectromechanical component 1 with a cavity housing 7 and rubber-like silicone gel covering 10. This injection mold 20 has a first mold half 24, in which the cavity housing 7 can be hung and aligned with the aid of the external terminals 9. An intermediate space 25 thereby remains between the cavity housing 7 and the inner sides 21 of the first mold half 24. In addition, the injection mold 20 has a second mold half 26, which has a punch 22, which is arranged over the rubber-elastic covering 10 when the injection mold 20 is open and has a cross section which corresponds to the size of the pressure-sensitive region 3 of the semiconductor chip 2. This punch 22 is aligned with the pressure-sensitive region 3.

FIG. 3 illustrates a schematic cross section through a closed injection mold 20 according to FIG. 2 before injection of a plastic encapsulation. When the two mold halves 24 and 26 are moved together, the punch 22 penetrates into the rubber-elastic covering 10 and displaces the latter, apart from a rubber-elastic layer 5 over the pressure-sensitive region 3 of the semiconductor chip 2. When the injection mold 20 is closed, an intermediate space 25 forms between the inner walls 21 of the injection mold 20 and the cavity housing 7 with the rubber-elastic covering 10, which in a further method step is filled with a plastic encapsulation.

Figure 4:
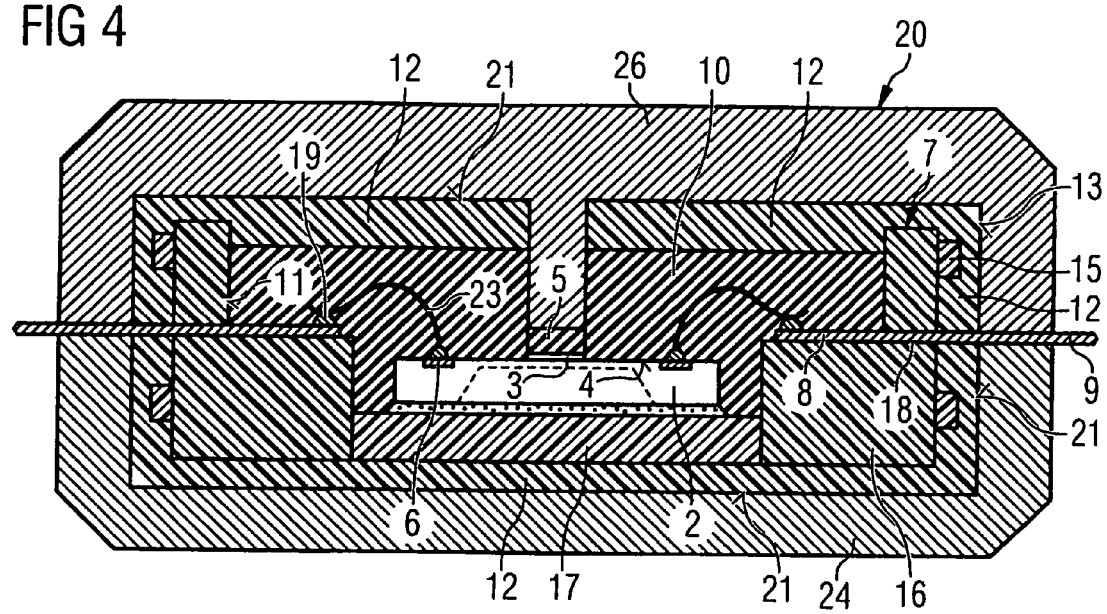
FIG. 4 illustrates a schematic cross section through a closed injection mold according to FIG. 3 after injection of the plastic encapsulation.

FIG. 4 illustrates a schematic cross section through a closed injection mold 20 according to FIG. 3 after injection of the plastic encapsulation 12. When the plastic encapsulation 12 is injected, the punch 22 of the second mold half 26 has the effect at the same time of producing an opening in the plastic encapsulation 12, which on account of the length of the punch 22 reaches the pressure-sensitive region 3 of the semiconductor chip 2.

Figure 5:
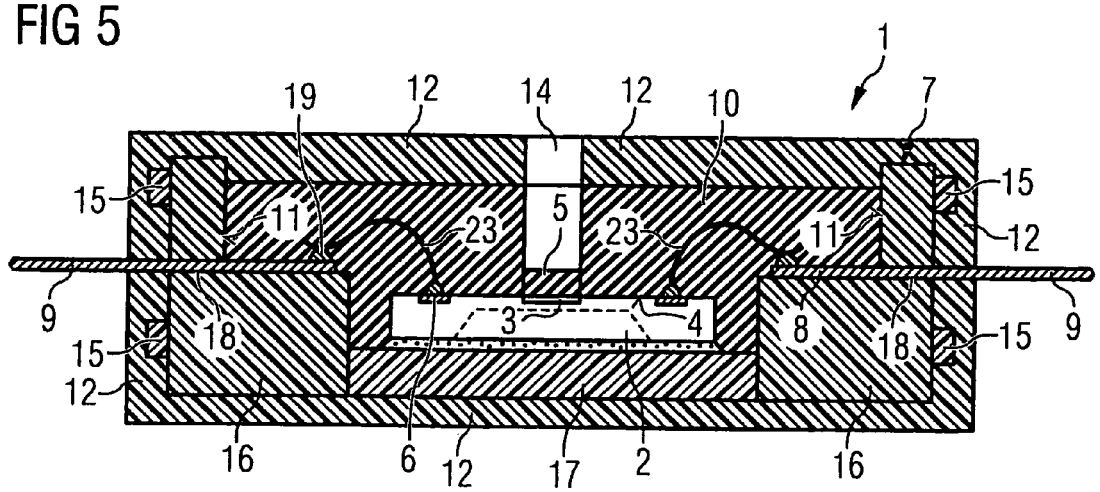
FIG. 5 illustrates a schematic cross section of the microelectromechanical component after removal of the injection mold according to FIG. 4.

FIG. 5 illustrates a schematic cross section through the microelectromechanical component 1 after removal from the injection mold 20 according to FIG. 4, the plastic encapsulation 12 then completely enclosing the component 1, apart from the opening 14 and the external terminals 9, only a thin rubber-elastic layer 5 remaining on the pressure-sensitive region 3 of the semiconductor chip 2 after the punch is withdrawn.

The invention claimed is:

1. A micro-electromechanical component comprising:
   means for providing a cavity housing;
   a semiconductor chip arranged in the cavity housing means, the semiconductor chip having a pressure sensitive region, and means for providing a rubber-elastic layer configured over the pressure sensitive region; and
   means for providing a rubber-elastic covering that covers the pressure sensitive region.

2. The component of claim 1, comprising:
   means for providing a plastic encapsulation that encapsulates the rubber-elastic covering means, having an opening to the pressure sensitive region.

3. A method for producing a microelectromechanical component with a pressure-sensitive semiconductor chip comprising:
   providing a semiconductor chip with a pressure-sensitive region on an active upper side and with contact areas outside the pressure-sensitive region;
   injection-molding a cavity housing that is open on one side, with side walls and a cavity base, electrical leadthroughs from external terminals to inner contact terminal areas being cast into the side walls;
   arranging the semiconductor chip on the cavity base;
   establishing electrical connections between the contact terminal areas and the contact areas;
   introducing a rubber-elastic covering compound into the cavity housing, thereby filling the cavity with a covering;
   installing the cavity housing with the covering compound in an open injection mold, while retaining a distance from the inner sides of the injection mold, the injection mold having a punch for immersion in the rubber-elastic covering compound and the punch covering the pressure-sensitive region of the semiconductor chip while maintaining a distance;
   closing the injection mold, thereby forming a rubber-elastic layer between the punch and the pressure-sensitive region of the semiconductor chip, injecting a plastic molding compound as a plastic encapsulation, which encapsulates outer sides of the prefabricated cavity housing and the rubber-elastic covering compound and leaves an opening to the rubber-elastic layer on the pressure-sensitive region of the semiconductor chip free.

4. A method for producing a microelectromechanical component
   comprising:
   providing a semiconductor chip having a pressure-sensitive region on an upper active side, and having contact areas outside the pressure-sensitive region;
   providing a cavity housing open on one side;
   arranging the semiconductor chip in the cavity housing;
   forming a rubber-elastic layer over the pressure sensitive region; and
   forming a rigid plastic encapsulation having an opening to the pressure sensitive region.

5. The method of claim 4, comprising:
forming the rubber-elastic layer to have a first thickness and the rubber-elastic covering to have a second thickness greater than the first thickness.

6. The method of claim 4, comprising:
forming the cavity housing to comprise on the outer sides anchoring elements, that mechanically connect the cavity housing and the plastic encapsulation to each other with positive engagement.

7. A micro-electromechanical component comprising:
a cavity housing;
a semiconductor chip arranged in the cavity housing, the semiconductor chip having a pressure sensitive region, and a rubber-elastic layer configured over the pressure sensitive region; and
a rubber-elastic covering that covers the pressure sensitive region.

8. The component of claim 7, comprising:
a plastic encapsulation that encapsulates the rubber-elastic covering.

9. The component of claim 7, comprising wherein the plastic encapsulation has only one opening, the opening positioned adjacent the pressure sensitive region.

10. The component of claim 8, comprising wherein:
the plastic encapsulation at least partially encapsulates the cavity housing.

11. The component of claim 8, comprising wherein:
the plastic encapsulation is a rigid plastic encapsulation.

12. The component of claim 9, comprising wherein the opening has a size corresponding to the pressure sensitive region.

13. The component of claim 11, comprising:
wherein the cavity housing includes outer sides; and
the plastic encapsulation is configured to encapsulate the rubber-elastic covering and the outer sides of the cavity housing.

14. A micro-electromechanical component comprising:
a cavity housing;
a semiconductor chip arranged in the cavity housing, the semiconductor chip having a pressure sensitive region, and a rubber-elastic layer configured over the pressure sensitive region;
a rubber-elastic covering that covers the pressure sensitive region; and
a rigid plastic encapsulation that encapsulates the rubber-elastic covering.

15. The component of claim 14, comprising wherein:
the plastic encapsulation at least partially encapsulates the cavity housing.

16. The component of claim 14, comprising wherein the rubber-elastic layer has a first thickness and the rubber-elastic covering has a second thickness greater than the first thickness.

17. The component of claim 15, comprising:
wherein the cavity housing includes outer sides; and
the plastic encapsulation is configured to encapsulate the rubber-elastic covering and the outer sides of the cavity housing.

18. The component of claim 17, comprising wherein the plastic encapsulation has an opening to the pressure sensitive region.

19. The component of claim 18, comprising wherein the opening has a size corresponding to the pressure sensitive region.

20. A microelectromechanical component comprises:
a semiconductor chip having a pressure-sensitive region on an active upper side, a rubber-elastic layer on the pressure-sensitive region, and contact areas outside the pressure-sensitive region;
a prefabricated cavity housing open on one side, having electrical connections between external terminals of the component and the contact areas of the semiconductor chip;
a rubber-elastic covering that covers the upper side of the semiconductor chip, partial regions of the electrical connections in an interior of the cavity housing and inner sides of the cavity housing;
a plastic encapsulation that encapsulates outer sides of the prefabricated cavity housing and the rubber-elastic covering compound of the covering and has an opening to the rubber-elastic layer on the pressure-sensitive region of the semiconductor chip.

21. The component of claim 20, comprising wherein the rubber-elastic layer comprises a smaller thickness than a thickness of the rubber-elastic covering.

22. The component of claim 20, comprising wherein the cavity housing comprises on the outer sides anchoring elements, that mechanically connect the cavity housing and the plastic encapsulation to each other with positive engagement.

23. The component of claim 21, comprising wherein the size of the opening in the plastic encapsulation corresponds to a size of the pressure-sensitive region.

* * * * *